United States Patent
Kim et al.

(10) Patent No.: US 8,343,851 B2
(45) Date of Patent: Jan. 1, 2013

(54) WAFER TEMPORARY BONDING METHOD USING SILICON DIRECT BONDING

(75) Inventors: Jung-ho Kim, Suwon-si (KR); Dae-lok Bae, Seoul (KR); Jong-wook Lee, Yongin-si (KR); Seung-woo Choi, Seoul (KR); Pil-kyu Kang, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 471 days.

(21) Appl. No.: 12/585,537

(22) Filed: Sep. 17, 2009

(65) Prior Publication Data

US 2010/0068868 A1    Mar. 18, 2010

(30) Foreign Application Priority Data

Sep. 18, 2008   (KR) .................. 10-2008-0091616

(51) Int. Cl.
  *H01L 21/30*   (2006.01)
  *H01L 21/18*   (2006.01)
(52) U.S. Cl. ............... 438/458; 438/459; 257/E21.088
(58) Field of Classification Search .......... 438/455, 438/459, 458; 257/E21.088
  See application file for complete search history.

(56) References Cited

U.S. PATENT DOCUMENTS

| | | | | |
|---|---|---|---|---|
| 4,599,792 A | * | 7/1986 | Cade et al. | 438/454 |
| 4,771,016 A | * | 9/1988 | Bajor et al. | 438/455 |
| 4,878,957 A | * | 11/1989 | Yamaguchi et al. | 148/33.3 |
| 4,983,251 A | * | 1/1991 | Haisma et al. | 438/3 |
| 5,234,860 A | * | 8/1993 | Gluck | 438/67 |
| 5,236,118 A | * | 8/1993 | Bower et al. | 228/193 |
| 5,266,135 A | * | 11/1993 | Short et al. | 438/455 |
| 5,286,670 A | * | 2/1994 | Kang et al. | 438/155 |
| 5,324,678 A | * | 6/1994 | Kusunoki | 438/459 |
| 5,387,555 A | * | 2/1995 | Linn et al. | 438/455 |
| 5,451,547 A | * | 9/1995 | Himi et al. | 438/455 |
| 5,849,627 A | * | 12/1998 | Linn et al. | 438/455 |
| 5,932,048 A | * | 8/1999 | Furukawa et al. | 156/153 |
| 6,312,797 B1 | * | 11/2001 | Yokokawa et al. | 428/336 |
| 6,339,010 B2 | * | 1/2002 | Sameshima | 438/458 |
| 6,506,664 B1 | * | 1/2003 | Beyne et al. | 438/455 |
| 6,902,987 B1 | * | 6/2005 | Tong et al. | 438/455 |
| 6,936,482 B2 | * | 8/2005 | Auberton-Herve | 438/14 |
| 7,041,178 B2 | * | 5/2006 | Tong et al. | 148/33.4 |
| 7,071,077 B2 | * | 7/2006 | Maleville et al. | 438/455 |
| 7,396,734 B2 | * | 7/2008 | Moriwaki | 438/406 |

FOREIGN PATENT DOCUMENTS

| | | |
|---|---|---|
| JP | 5-21765 | 1/1993 |
| JP | 2007-188967 | 7/2007 |
| KR | 10-2007-83581 | 8/2007 |

* cited by examiner

*Primary Examiner* — Mary Wilczewski
(74) *Attorney, Agent, or Firm* — Harness, Dickey & Pierce, P.L.C.

(57) ABSTRACT

A wafer temporary bonding method using silicon direct bonding (SDB) may include preparing a carrier wafer and a device wafer, adjusting roughness of a surface of the carrier wafer, and combining the carrier wafer and the device wafer using the SDB. Because the method uses SDB, instead of an adhesive layer, for a temporary bonding process, a module or process to generate and remove an adhesive is unnecessary. Also, a defect in a subsequent process, for example, a back-grinding process, due to irregularity of the adhesive may be prevented.

16 Claims, 5 Drawing Sheets

US 8,343,851 B2

WAFER TEMPORARY BONDING METHOD USING SILICON DIRECT BONDING

CROSS-REFERENCE TO RELATED APPLICATIONS

This application claims priority under 35 U.S.C. §119 to Korean Patent Application No. 10-2008-0091616, filed on Sep. 18, 2008, in the Korean Intellectual Property Office (KIPO), the entire contents of which are herein incorporated by reference.

BACKGROUND

1. Field

Example embodiments relate to a semiconductor device and a fabrication method thereof, and more particularly, to a temporary bonding method used to thin wafers and a method of fabricating a semiconductor device using the method.

2. Description of the Related Art

As a demand for thinner die packages by manufacturers increases, one of the methods to reduce the overall height of a package is to thin a silicon die. A thinning process may be performed on a silicon wafer prior to die singulation. However, as the size of a wafer increases and a die becomes thinner, the overall structural strength of the wafer may decrease. As a result, when such thin wafers are processed using existing apparatuses and materials, a relatively large thin wafer may be easily destroyed.

A wafer on which a device may be implemented (a device wafer) may be attached to a carrier wafer using an adhesive, thereby increasing mechanical strength. A desired process, for example, a thinning process, may be performed so that a relatively thin film is separated before the singulation is completed. The adhesive and substrate may work as mechanical supports providing structural stability during the process. The carrier wafer may be separated from the device wafer after the thinning process, accordingly, the process of attaching the device wafer to the carrier wafer for thinning of the device wafer may be referred to as a temporary bonding process. An example of a process that may use the temporary bonding process may include a back-grinding process.

SUMMARY

Example embodiments provide a wafer temporary bonding method which may solve a defect generated in a subsequent process due to an irregularity of an adhesive layer and a complexity in a structure of an additional module needed for a process of forming and removing the adhesive layer, associated with a conventional temporary bonding process. Example embodiments also provide for a semiconductor device and fabrication method thereof using the wafer temporary bonding method.

In accordance with example embodiments, a wafer temporary bonding method using silicon direct bonding (SDB) may include preparing a carrier wafer and a device wafer, adjusting a roughness of a surface of the carrier wafer, and combining the carrier wafer and the device wafer using SDB.

In accordance with example embodiments, a method of fabricating a semiconductor device may include bonding a carrier wafer and a device wafer using SDB (silicon direct bonding), back-grinding the device wafer, and separating the carrier wafer from the device wafer.

According to example embodiments, there is provided a wafer temporary bonding method using silicon direct bonding (SDB) including preparing a carrier wafer and a device wafer, adjusting roughness of a surface of the carrier wafer, and combining the carrier wafer and the device wafer using SDB.

The adjusting of roughness of a surface of the carrier wafer may be performed by at least one of plasma processing, wet etching, cleaning, and thin film deposition. The adjusting of roughness of a surface of the carrier wafer may include adjusting roughness of a surface of the device wafer. The roughness of a surface of the carrier wafer may be processed to have a bonding strength enough to sustain the device wafer in a subsequent back-grinding process and be separated from the device wafer in a separation process.

The combining of the carrier wafer and the device wafer using the SDB may include cleaning the device wafer by dipping the device wafer in deionized water, combining the carrier wafer to the device wafer, and annealing the combined carrier wafer and device wafer.

According to example embodiments, a method of fabricating a semiconductor device may include temporarily bonding a carrier wafer and a device wafer using SDB (silicon direct bonding), back-grinding the device wafer, and separating the carrier wafer from the device wafer.

Before the separating of the carrier wafer from the device wafer, at least another device wafer may be combined to the device wafer. The separating of the carrier wafer from the device wafer may be performed using a blade or separation solvent. A bonding strength of the temporary bonding of the carrier wafer and the device wafer may be such that the carrier wafer sustains the device wafer in a subsequent back-grinding process and is separated from the device wafer in a separation process, and roughness of surfaces of the carrier wafer and the device wafer may be adjusted before being combined to each other for the bonding strength.

According to example embodiments, there is provided a semiconductor device fabricated using the above method.

The semiconductor device may be a wafer level multi-stack package semiconductor device.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
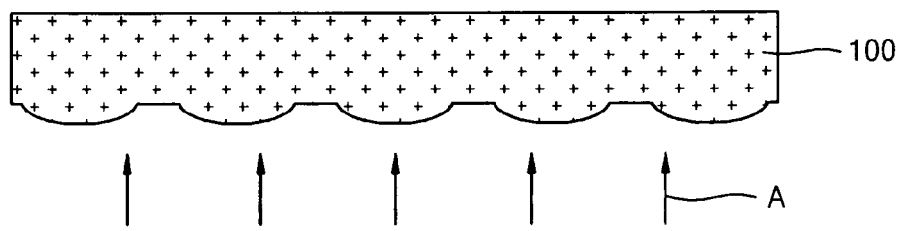
FIG. 1 is a cross sectional view illustrating the adjustment of a roughness of a carrier wafer in accordance with example embodiments.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Example embodiments will now be described more fully with reference to the accompanying drawings, in which example embodiments of the invention are shown. It will also be understood that when a layer is referred to as being "on" another layer or substrate, it can be directly on the other layer or substrate, or intervening layers may also be present. In the drawings, the thicknesses of layers and regions are exaggerated for clarity. Like reference numerals in the drawings denote like elements, and thus their description will be omitted. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a cross sectional view illustrating the adjustment of a roughness of a carrier wafer 100. Referring to FIG. 1, a surface process A may be performed to adjust the roughness of a surface of the carrier wafer 100. The surface process A may be performed by at least one of plasma processing, wet etching, cleaning, and thin film deposition. The surface roughness of the carrier wafer 100 may affect a bond strength between a carrier wafer 100 and another component, for example, the device wafer 200 illustrated in FIG. 2. The surface roughness of the carrier wafer 100 may be configured to allow the carrier wafer 100 and the device wafer 200, for example, to be bonded with a strength high enough to allow the carrier wafer 100 to sustain the device wafer 200 during a back-grinding process while at the same time be low enough to allow for relatively easy separation of the carrier wafer 100 from the device wafer 200 during a separation process. In FIG. 1, the surface after the surface process A is exaggerated for clarity. The actual surface roughness of the carrier wafer 100 after the surface process A may be invisible to the naked eye.

Figure 2:
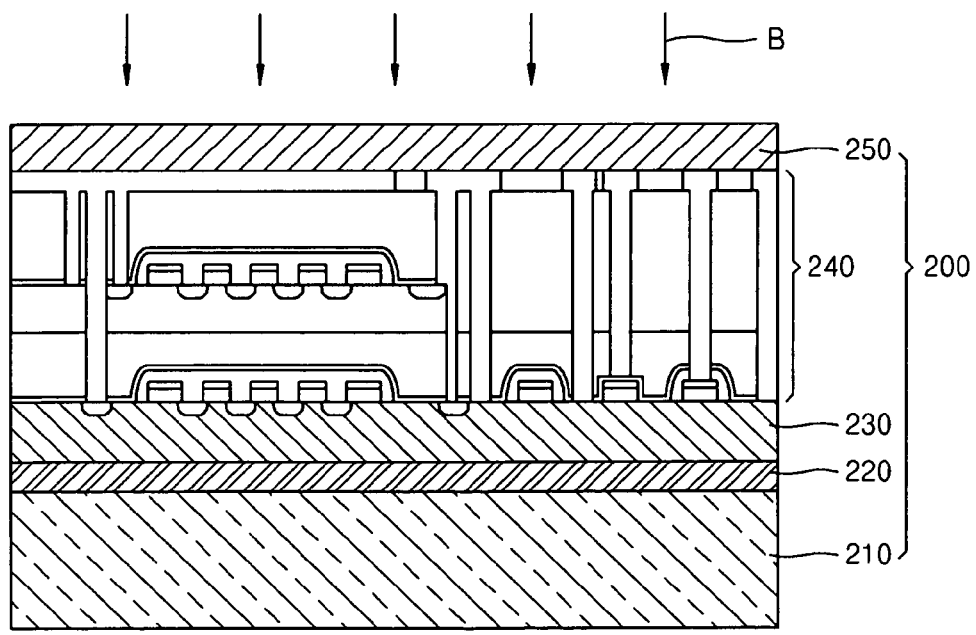
FIG. 2 is a cross sectional view illustrating the processing of a surface of a device wafer in accordance with example embodiments.

FIG. 2 is a cross sectional view illustrating the processing of a surface of a device wafer 200. Referring to FIG. 2, the device wafer 200 may include a silicon substrate 210, a buried oxide layer (BOX) 220, a silicon on insulator (SOI) 230, a device layer 240, and an upper oxide film 250.

A surface process B may be performed to adjust a roughness of a surface of the device wafer 200. Also, the surface process B may enhance a bonding strength with the carrier wafer 100 (a surface activation process). The surface process B of the device wafer 200 may be performed by at least one of plasma processing, wet etching, cleaning, and thin film deposition.

Figure 3:
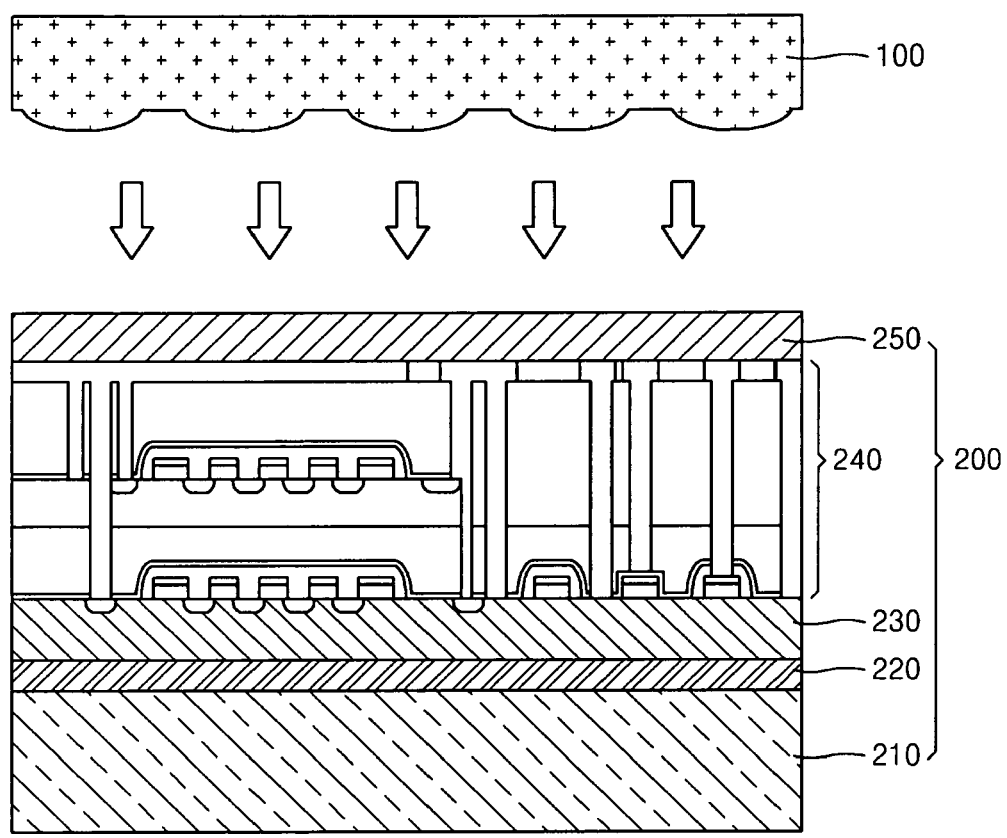
FIGS. 3 and 4 are cross sectional views illustrating that the carrier wafer and the device wafer are combined by SDB in accordance with example embodiments.
Figure 4:
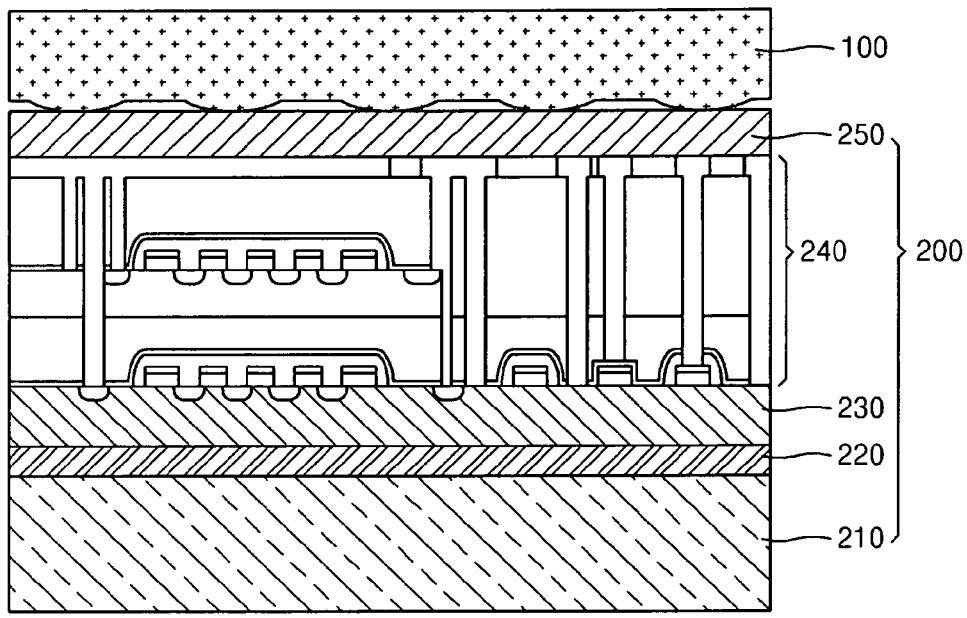

FIGS. 3 and 4 are cross sectional views illustrating that the carrier wafer 100 and the device wafer 200 may be combined by silicon (Si) direct bonding (SDB). Referring to FIG. 3, the carrier wafer 100 and the device wafer 200, whose roughness as may be adjusted, may be cleaned and combined to each other. The cleaning process may be performed to facilitate the combination of the two wafers 100 and 200 by removing impurities on the surfaces of the carrier wafer 100 and the device wafer 200 and increasing a hydrophilic property. The cleaning process may be performed by a first dipping of the two wafers 100 and 200 in a SC1 (Standard Cleaning 1) solution that may include NH4OH, H2O2, and deionized water and a second dipping in a SC2 (Standard Cleaning 2) solution that may include HCl, H2O2, and deionized water.

Referring to FIG. 4, the two wafers 100 and 200 may be combined and annealing may be performed so that the two wafers 100 and 200 are combined to each other. As described above, the bonding strength of the two wafers 100 and 200 may be sufficiently high to sustain the device wafer 200 in a back-grinding process. In addition, the bonding strength of the two wafers 100 and 200 may also be sufficiently low to allow the carrier wafer 100 to be separated from the device wafer 200 during a separation process. The bonding strength may be greatly dominated by a degree of the surface roughness according to the surface process of the carrier wafer 100 and/or the device wafer 200. The combination of the two wafers 100 and 200 without an adhesive through the cleaning and annealing process is referred to the SDB.

Figure 5:
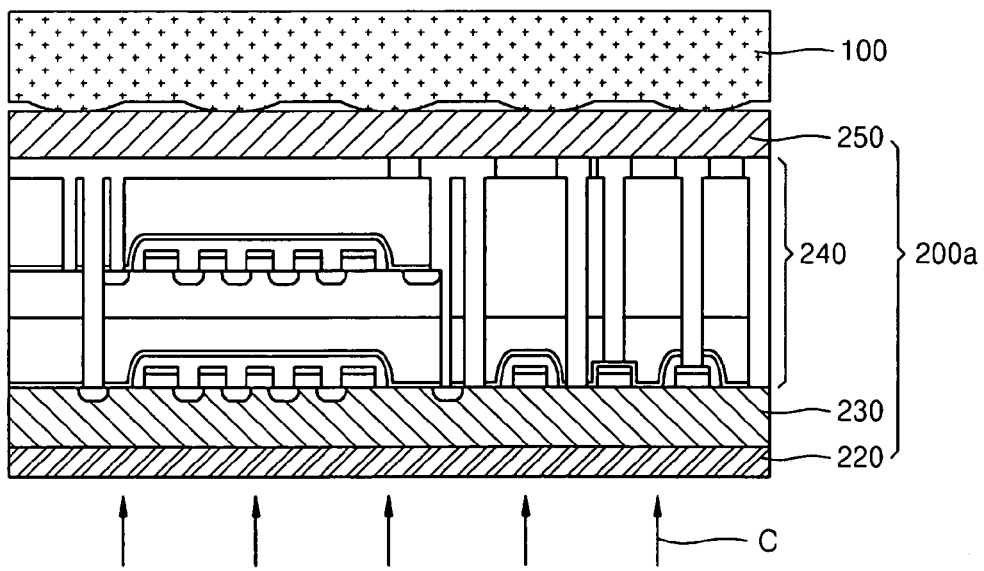
FIG. 5 is a cross sectional view illustrating that the device wafer may be back-ground after the carrier wafer and the device wafer are combined to each other in accordance with example embodiments.

FIG. 5 is a cross sectional view illustrating that the device wafer 200 may be back-ground. Referring to FIG. 5, the carrier wafer 100 may be combined to the device wafer 200 and a back-grinding process C may be performed with respect to the device wafer 200. The silicon substrate 210 of the device wafer 200 may be removed through the back-grinding process so that a device wafer 200a that is thinned may be obtained.

Figure 6:
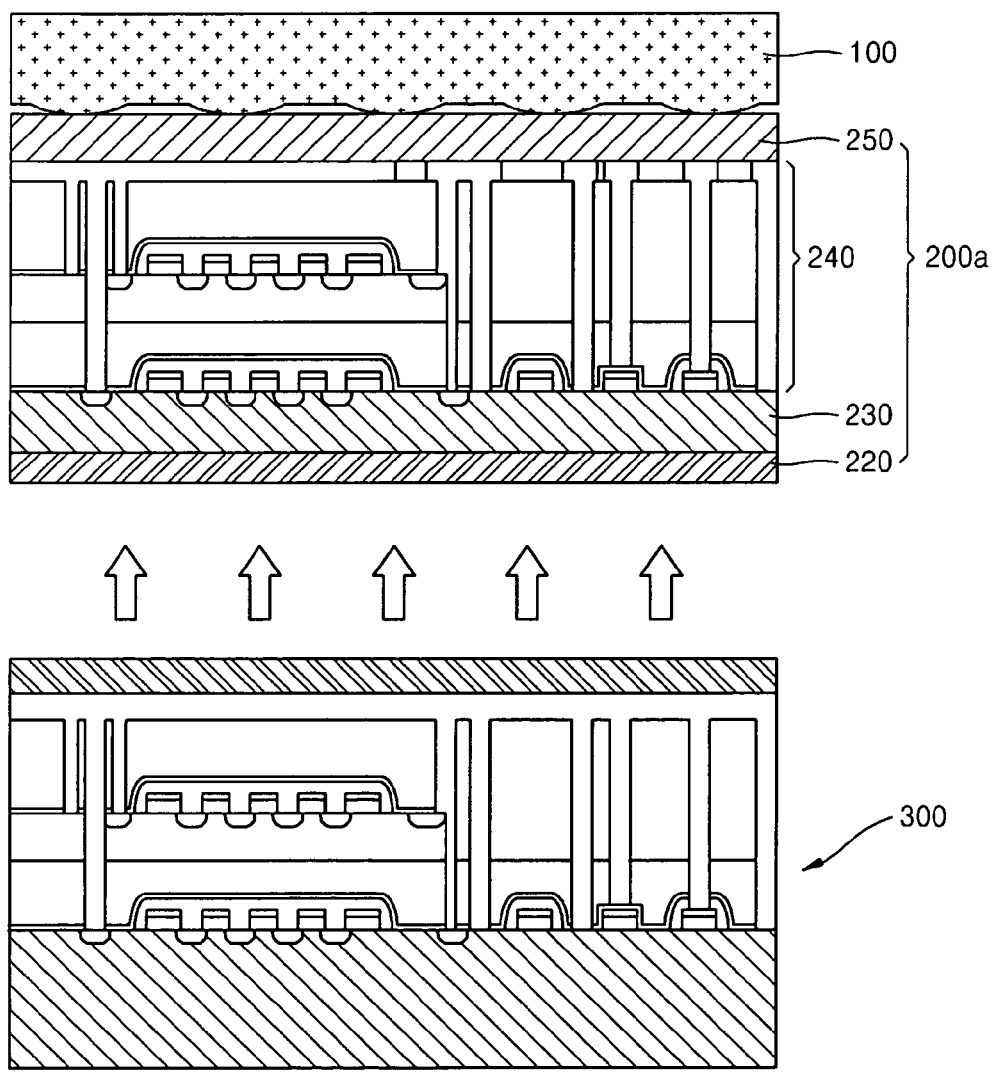
FIG. 6 is a cross sectional view illustrating that another device wafer may be combined to the back-ground device wafer in accordance with example embodiments.

FIG. 6 is a cross sectional view illustrating that another device wafer 300 may be combined to the back-ground device wafer 200a. The device wafer 300 may be combined with the device wafer 200a by SDB. However, example embodiments are not limited thereto. For example, the device wafer 300 may be combined to the device wafer 200a using an adhesive. Also, the number of the device wafers is not limited to one so that a plurality of device wafers may be combined to the device wafer 200a. That is, many other back-ground device wafers may be sequentially combined to the lower surface of the back-ground device wafer 200a. Accordingly, a thin wafer level multi-stack package semiconductor device may be implemented by combining the wafers.

Figure 7:
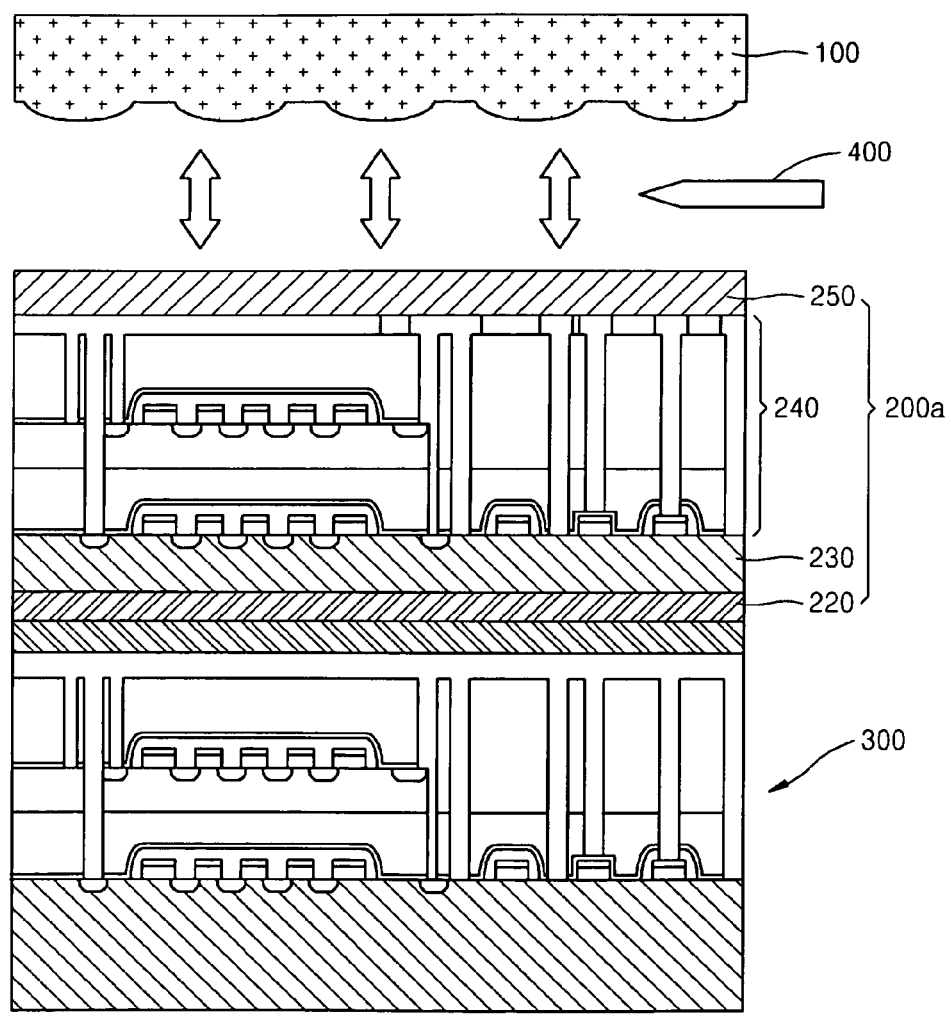
FIG. 7 is a cross sectional view illustrating that the carrier wafer may be separated after combining other device wafers in accordance with example embodiments.

FIG. 7 is a cross sectional view illustrating that the carrier wafer 100 may be separated from the wafers 200a and 300. Referring to FIG. 7, the two device wafers 200a and 300 may be combined and the carrier wafer 100 may be separated and thus removed from the two device wafers 200a and 300. The carrier wafer 100 may be separated using a blade splitter 400. Also, the carrier wafer 100 may be separated by injecting an appropriate separation solvent between the carrier wafer 100 and the device wafer 200a. After undergoing an appropriate roughness process, the separated carrier wafer 100 may be reused as a support substrate for a back-grinding process for another device wafer.

As described above, the wafer temporary bonding method using SDB, and a semiconductor device and fabrication method thereof using the wafer temporary bonding method according example embodiments may reduce or eliminate defects in a back-grinding process due to the irregularity of a conventional adhesive layer. Also, because the adhesive layer is not formed, process costs and fabrication times may be reduced because operations for forming and removing the adhesive layer are not needed. Furthermore, because the carrier wafer may be easily separated using the blade, a problem of an adhesive material remaining after the separation of the carrier wafer may be prevented or reduced.

In the method of fabricating a semiconductor device according to example embodiments, because the roughness of the carrier wafer or the device wafer is appropriately adjusted before the SDB temporary bonding, the bond strength between carrier wafer and a device wafer may be tailored so that the device wafer may be firmly sustained during a back-grinding process and easily separable from the carrier wafer during a separation process using, for example, a blade to separate a carrier wafer from a device wafer.

While the inventive concept has been particularly shown and described with reference to example embodiments thereof, it will be understood that various changes in form and details may be made therein without departing from the spirit and scope of the following claims.

What is claimed is:

1. A wafer temporary bonding method using silicon direct bonding (SDB), the method comprising:
   preparing a carrier wafer and a device wafer;
   adjusting a roughness of a surface of the carrier wafer;
   combining the carrier wafer and the device wafer using SDB;
   back-grinding the device wafer; and
   separating the carrier wafer from the device wafer in a separation process.

2. The method of claim 1, wherein the roughness of the surface of the carrier wafer is adjusted to have a bonding strength sufficient to sustain the device wafer in a subsequent process and to allow separation from the device wafer in the separation process.

3. The method of claim 2, wherein the subsequent process is a back-grinding process.

4. The method of claim 2, wherein the separation process includes using at least one of a blade and a separation solvent.

5. The method of claim 1, wherein adjusting the roughness of the surface of the carrier wafer includes performing at least one of plasma processing, wet etching, cleaning, and thin film deposition.

6. The method of claim 1, wherein combining the carrier wafer and the device wafer using SDB includes
   cleaning the device wafer by dipping the device wafer in deionized water;
   mounting the carrier wafer on the device wafer; and
   annealing the carrier wafer and device wafer.

7. The method of claim 1, further comprising:
   combining at least another device wafer to the device wafer.

8. The method of claim 1, further comprising:
   adjusting a roughness of a surface of the device wafer.

9. The method of claim 1, wherein the separation process includes using at least one of a blade and separation solvent.

10. The method of claim 9, wherein the roughness of the surface of the carrier wafer and a roughness of a surface of the device wafer are adjusted so that a bonding strength between the carrier wafer and the device wafer is sufficient to sustain the device wafer in a back-grinding process and is sufficient to allow separation of the carrier wafer from the device wafer in the separation process.

11. A method of fabricating a semiconductor device, the method comprising: bonding a carrier wafer and a device wafer using SDB (silicon direct bonding);
   back-grinding the device wafer; and
   separating the carrier wafer from the device wafer in a separation process.

12. The method of claim 11, wherein bonding the carrier wafer and the device wafer includes
   preparing the carrier wafer and the device wafer,
   adjusting a roughness of a surface of the carrier wafer, and
   combining the carrier wafer and the device wafer using SDB.

13. The method of claim 12, wherein adjusting the roughness of the surface of the carrier wafer includes performing at least one of plasma processing, wet etching, cleaning, and thin film deposition.

14. The method of claim 12, further comprising:
   adjusting a roughness of a surface of the device wafer using at least one of plasma processing, wet etching, cleaning, and thin film deposition.

15. The method of claim 12, wherein combining the carrier wafer and the device wafer using SDB includes
   cleaning the device wafer by dipping the device wafer in deionized water;
   mounting the carrier wafer on the device wafer; and
   annealing the carrier wafer and device wafer.

16. The method of claim 12, wherein the roughness of the surface of the carrier wafer and a roughness of a surface of the device wafer are adjusted so that a bonding strength between the carrier wafer and the device wafer is sufficient to sustain the device wafer in a back-grinding process and is sufficient to allow separation of the carrier wafer from the device wafer in the separation process.

* * * * *